United States Patent
Kao

(10) Patent No.: US 7,408,211 B2
(45) Date of Patent: Aug. 5, 2008

(54) TRANSFER TRANSISTOR OF CMOS IMAGE SENSOR

(75) Inventor: Ching-Hung Kao, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 106 days.

(21) Appl. No.: 11/558,447

(22) Filed: Nov. 10, 2006

(65) Prior Publication Data

US 2008/0111165 A1  May 15, 2008

(51) Int. Cl.
*H01L 31/062* (2006.01)

(52) U.S. Cl. ...................... 257/292; 257/257

(58) Field of Classification Search ................ 257/292, 257/225, 404, 257
See application file for complete search history.

(56) References Cited

U.S. PATENT DOCUMENTS 6,630,701 B1   10/2003   Rhodes
7,214,974 B2 *  5/2007   Shin .......................... 257/225

* cited by examiner

*Primary Examiner*—Mark Prenty
(74) *Attorney, Agent, or Firm*—Jianq Chyun IP Office

(57) ABSTRACT

A transfer transistor of a CMOS image sensor is described, including a substrate of a first type, a gate dielectric layer on the substrate, a gate on the gate dielectric layer, a first doped region of the first type, a buried channel region of the first or second type, a second doped region of the first type, and source/drain regions of the second type. The first doped region is in the substrate directly under the gate dielectric layer under the gate, the buried channel region is in the substrate under the first doped region, and the second doped region is in the substrate under the buried channel region. The source/drain regions are in the substrate beside the gate.

20 Claims, 2 Drawing Sheets

TRANSFER TRANSISTOR OF CMOS IMAGE SENSOR

BACKGROUND OF THE INVENTION

1. Field of Invention

This invention relates to a semiconductor device, and more particularly to a transfer transistor of a CMOS image sensor (CIS).

2. Description of Related Art

Current image sensors mainly include charge coupled device (CCD) and CMOS image sensor (CIS). CCDs feature high performance, but have certain problems. For example, CCD arrays are difficult to integrate with a CMOS process, complicating the integration of the on-chip drive and signal processing electronics. On the other hand, CMOS image sensors are advantageous over CCD imagers for allowing a low voltage operation and having low power consumption and lower fabrication costs. Therefore, CMOS image sensors are used more and more widely in image recording apparatuses.

However, conventional CMOS image sensors tend to suffer from the dart current that causes image lag lowering the quality of the recorded image. The major source of the dark current is the transfer transistor for transferring the photo-generated charges in the photodiode, while the dark current from the transfer transistor mainly come from the surface states at the interface between the substrate and the gate dielectric layer.

To reduce the dark current from the transfer transistor, U.S. Pat. No. 6,630,701 provides a transfer transistor of NMOS type having a buried channel, which is caused by forming an N-doped region directly under the surface of the P-substrate under the gate electrode. Because the buried channel does not include the substrate surface with surface states, the charges are not captured by the surface states to cause a dark current.

SUMMARY OF THE INVENTION

In view of the foregoing, this invention provides a transfer transistor of a CMOS image sensor that has a buried channel region, which can transfer the photo-generated charges more completely than a conventional buried-channel transfer transistor.

The transfer transistor of a CMOS image sensor of this invention includes a substrate of a first type, a gate dielectric layer on the substrate, a gate on the gate dielectric layer, a first doped region of the first type, a buried channel region, a second doped region of the first type, and source/drain regions of the second type. The first doped region is in the substrate directly under the gate dielectric layer under the gate, the buried channel region is in the substrate under the first doped region, and the second doped region is in the substrate under the buried channel region. The source/drain regions are in the substrate beside the gate, wherein one source/drain region is coupled to a photodiode of the CMOS image sensor. It is noted that in this invention, the term "first/second type" means "first/second conductivity type" hereinafter. Specifically, when the first type is P-type, the second type is N-type; when the first type is N-type, the second type is P-type.

By sandwiching the buried channel region between the two doped regions of the same conductivity type of the substrate, the electric potential near the transfer transistor is higher than that near a conventional buried-channel transfer transistor. Hence, the photo-generated charges are transferred more completely from the photodiode to the transfer transistor to further inhibit image lag.

In order to male the aforementioned and other objects, features and advantages of the present invention comprehensible, a preferred embodiment accompanied with figures is described in detail below.

DESCRIPTION OF EMBODIMENTS

Figure 1:
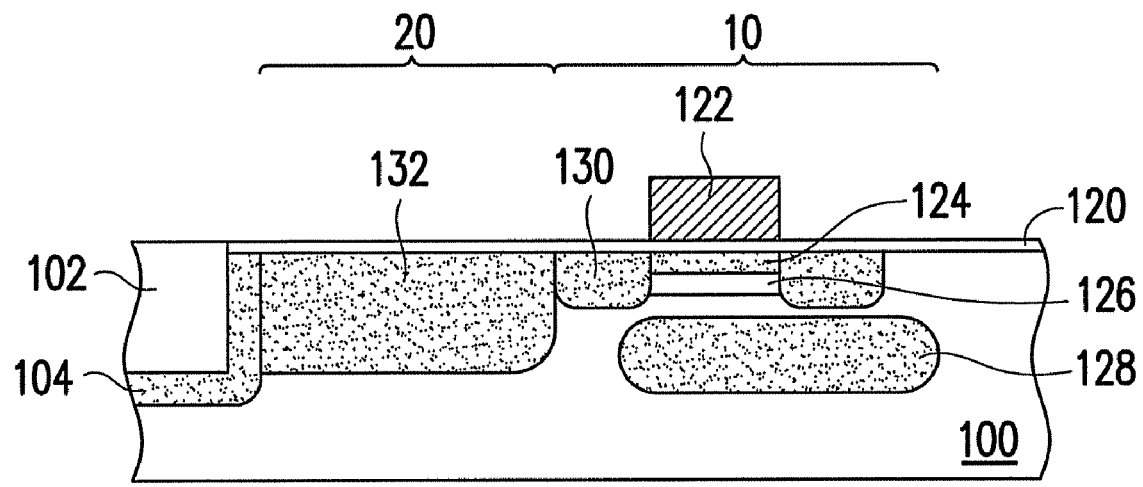
FIG. 1 illustrates a cross-sectional view of a transfer transistor of a CMOS image sensor according to a first or second embodiment of this invention.

FIG. 1 illustrates a cross-sectional view of a transfer transistor of a CMOS image sensor (CIS) according to the first or second embodiment of this invention.

First Embodiment

Referring to FIG. 1, the transfer transistor 10 includes a substrate 100 of a first type, a gate dielectric layer 120 on the substrate 100, a gate 122 on the gate dielectric layer 120, a doped region 124 of the first type, a buried channel region 126 as a doped region of the second type, a doped region 128 of the first type, and source/drain regions 130 of the second type. The substrate 100 may be a silicon wafer of the first type, or a well of the first type in a silicon wafer. The substrate 100 may have an isolation structure 102 therein, and a heavily doped region 104 with the same conductivity type of the substrate 100 may be formed in the substrate 100 around the isolation structure 102 to serve as a field isolation layer. The gate dielectric layer 120 may include silicon oxide, and the gate 122 may include doped polysilicon or a polycide structure.

The doped region 124 is in the substrate 100 directly under the gate dielectric layer 120 under the gate 122, the buried channel region 126 is in the substrate 100 under the doped region 124, and the doped region 128 is in the substrate 100 under the buried channel region 126. The source/drain regions 130 are in the substrate 100 beside the gate 122, wherein one source/drain region 130 is coupled to a photodiode 20 of the CIS, which includes a doped region 132 of the second type in the substrate 100 connected with the one source/drain region 130. The source/drain regions 130 are heavily doped, and have a dopant concentration much higher than that of each of the doped regions 124 and 128 and the buried channel region 126. In most applications, the above first type is P-type and the second type is N-type, while it is also possible that the first type is N-type and the second type is P-type.

Such a transfer transistor 10 is a junction field effect transistor (JFET) including a doped region of the second type as the buried channel region 126 connected between the two source/drain regions 130 of the second type and sandwiched between the two doped regions 124 and 128 of the first type. The JFET is normally at the On-state, and can be switched off as a sufficient voltage is applied to the gate 122 to expand the depletion region between the buried channel region 126 and the doped regions 124 and 128 closing the channel of the transistor.

Moreover, in some embodiments, the doped region 132 of the photodiode 20 is formed deeper than the source/drain regions 130 to improve the photosensitivity. In such cases, when the doped region 128 is also under the source/drain regions 130, the center of the doped region 128 is shifted relative to the center of the doped region 124 in the direction far away from the doped region 132 of the photodiode 20 to be apart from the same. If the doped region 128 of the first type were formed adjacent to the doped region 132 of the second type, the efficiency of the charge transfer would be lowered to cause an image lag effect.

In addition, the dopant concentration of the doped region 128 is preferably lower than that of the doped region 124 directly under the gate dielectric layer 120. In such cases, the doped region 124 may be a heavily doped region.

Second Embodiment

The structure of the transfer transistor 10 according to the second embodiment of this invention is similar to that in the first embodiment as shown in FIG. 1, except that the buried channel region 126 is a doped region of the same (first) type of the substrate 100 and the doped regions 124 and 128. In the embodiment, the buried channel region 126 has a dopant concentration lower that those of the doped regions 124 and 128, such that inversion will occur therein to form a channel between the two source/drain regions 130 as a sufficient voltage is applied to the gate 122. Such a transfer transistor 10 is a PMOS field effect transistor or a NMOS field effect transistor.

In the second embodiment, it is also preferred that the dopant concentration of the doped region 128 is lower than that of the first doped region 124 directly under the gate dielectric layer 120. In such cases, the doped region 124 may be a heavily doped region. In most applications, the above first type is P-type and the second type is N-type, while it is also possible that the first type is N-type and the second type is P-type.

Fabrications of Transfer Transistors

Figure 2:
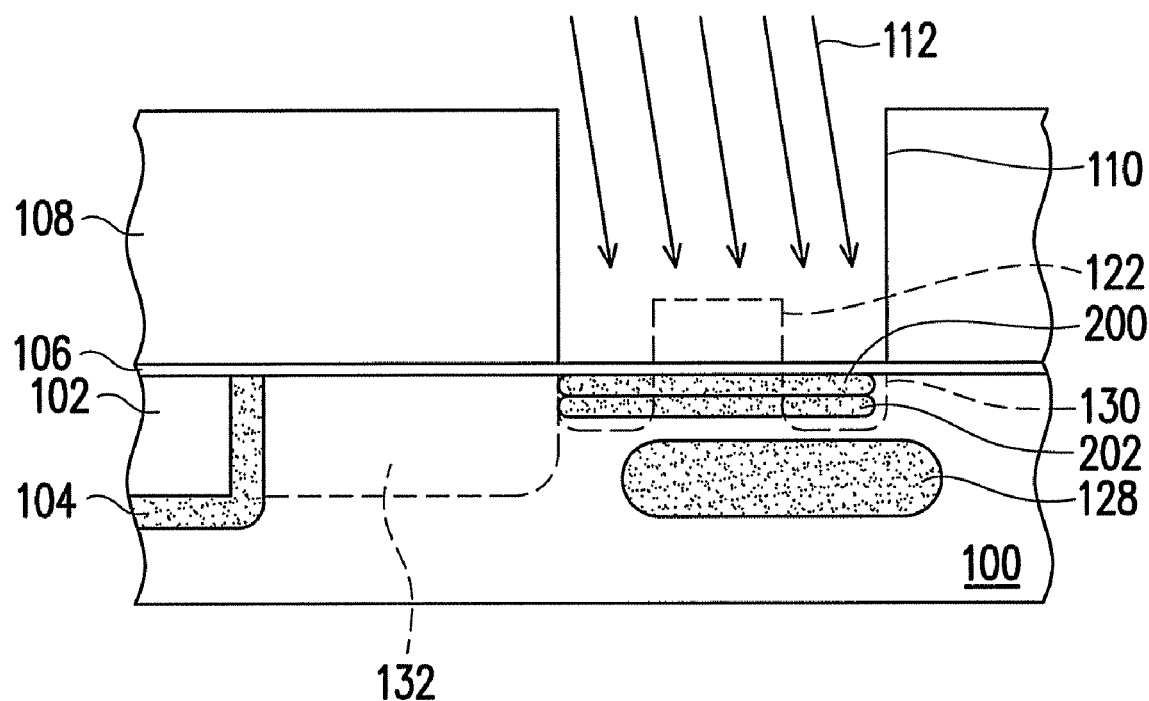
FIG. 2 illustrates a method of fabricating a transfer transistor of the first or second embodiment according to an embodiment of this invention.

FIG. 2 illustrates a method of forming a transfer transistor of the first or second embodiment according to an embodiment of this invention.

Referring to FIGS. 1 and 2 simultaneously, the implantation steps respectively for forming the doped regions 124 and 128 of the first type and the buried channel region 126 of the first or second type are preferably conducted before the gate dielectric layer 120 is formed to prevent degradation of the same. Before the implantation steps, a pad oxide 106 and a patterned photoresist layer 108 are sequentially formed on the substrate 100. The three implantation steps respectively for forming the doped regions 124, 126 and 128 are performed in any order. The opening 110 is preferably formed exposing at least a part of each S/D region 130, so that the channel profile can be controlled well.

When the opening 110 is formed exposing at least a part of each S/D region 130, the two implantation steps respectively for forming the doped regions 124 and 126 form two doped regions 200 and 202 that will be respectively trimmed to the regions 124 and 126 by the S/D regions 130 formed in the subsequent process. Moreover, when the opening 110 is formed so wide to be close to or even overlap with the area for forming the doped region 132 of the photodiode 20, the doped region 128 is preferably formed with tilt implantation 112, so that the center of the doped region 128 is shifted relative to the center of the doped region 124 in the direction far away from the doped region 132 of the photodiode 20 to prevent the efficiency of charge transfer from being lowered.

Property of Transfer Transistors

Figure 3:
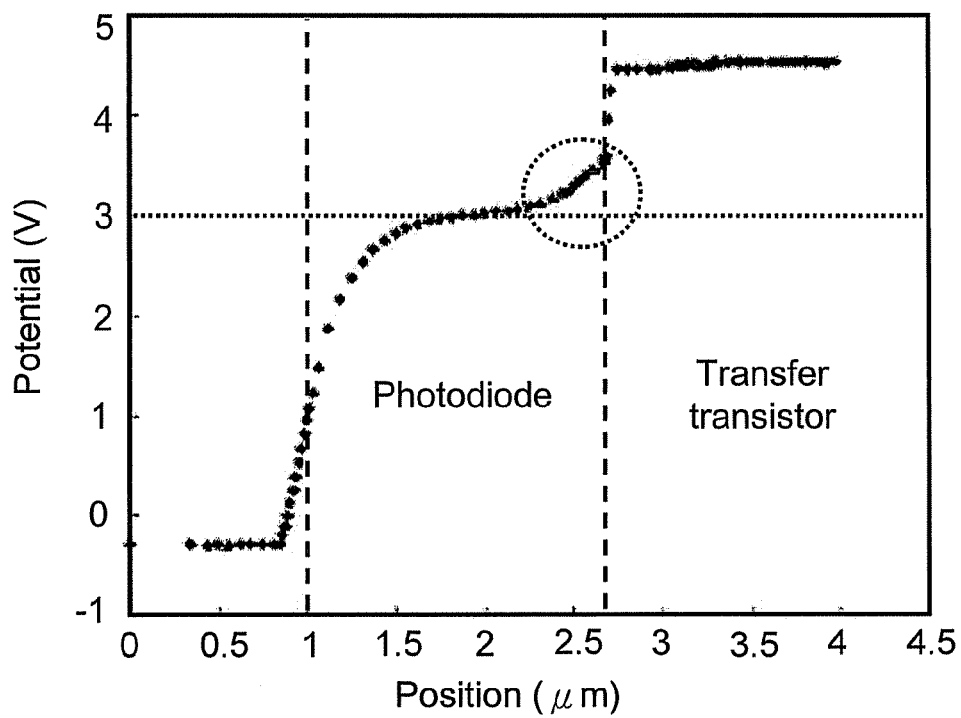
FIG. 3 shows a potential curve of a transfer transistor as an N-type junction field effect transistor (JFET) according to the first embodiment of this invention.
Figure 4:
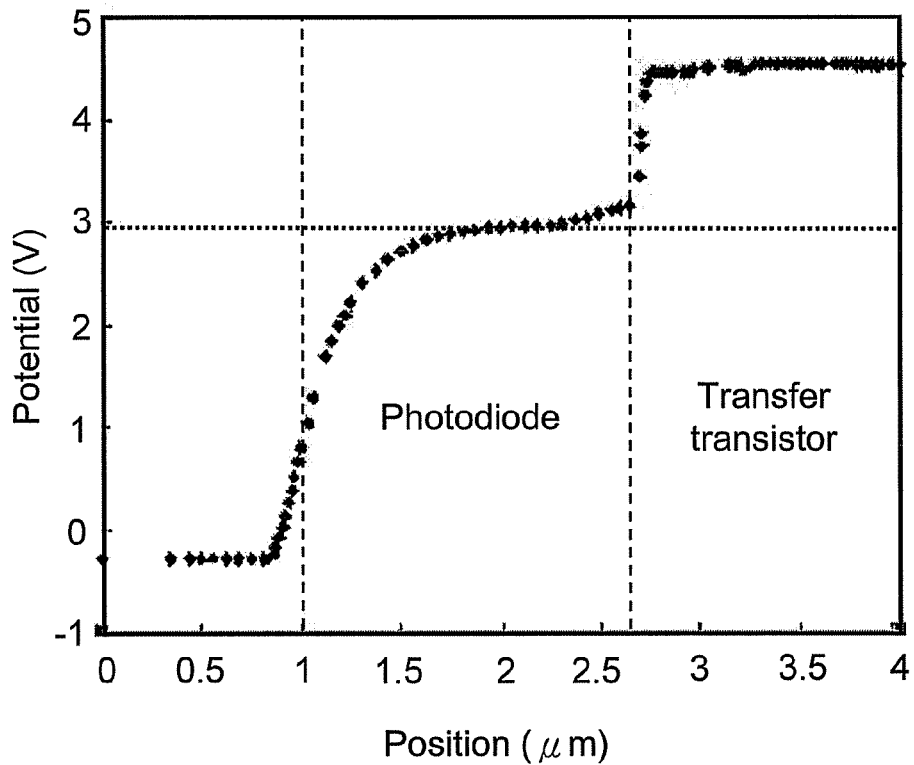
FIG. 4 shows a potential curve of a conventional N-type buried-channel transfer transistor of a CMOS image sensor.

FIG. 3 shows a potential curve of a transfer transistor as an N-type junction field effect transistor (JFET) according to the first embodiment of this invention, and FIG. 4 shows a potential curve of a conventional N-type buried-channel transfer transistor of a CIS that is similar to the transfer transistor disclosed in U.S. Pat. No. 6,630,701. The data points of each potential curve are measured as the transfer transistor is at the On-state that allows the photo-generated electrons to be transferred.

Referring to FIGS. 3 and 4 simultaneously, it is clear that the electrical potential near the transfer transistor as an N-type JFET according to the first embodiment is higher than that near the conventional N-type buried-channel transfer transistor, so that the photo-generated electrons are transferred more completely from the photodiode to the transfer transistor to further inhibit image lag in a CMOS image sensor including the transfer transistor of the first embodiment. It is also noted that a transfer transistor as a P-type JFET according to the first embodiment inversely has a potential lowering effect enhancing the electron-hole transfer, while the NMOS/PMOS transistor of the second embodiment has a similar potential raising/lowering effect to make the charge transfer more complete.

This invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A transfer transistor of a CMOS image sensor, comprising:
    a substrate of a first type;
    a gate dielectric layer on the substrate;
    a gate on the gate dielectric layer;
    a first doped region of the first type in the substrate directly under the gate dielectric layer under the gate;
    a buried channel region in the substrate under the first doped region;
    a second doped region of the first type in the substrate under the buried channel region; and
    source/drain regions of a second type in the substrate beside the gate, wherein one source/drain region is coupled to a photodiode of the CMOS image sensor.

2. The transfer transistor of claim 1, wherein a dopant concentration of the second doped region is lower than a dopant concentration of the first doped region.

3. The transfer transistor of claim 1, wherein the photodiode includes a doped region of the second type in the substrate connected with the one source/drain region, and the doped region of the photodiode is deeper than the source/drain regions.

4. The transfer transistor of claim 3, wherein the second doped region is also under the source/drain regions, and a center of the second doped region is shifted relative to a center of the first doped region to be apart from the doped region of the photodiode.

5. The transfer transistor of claim 1, wherein the first type is P-type and the second type is N-type, or the first type is N-type and the second type is P-type.

6. The transfer transistor of claim 1, wherein the substrate comprises a wafer of the first type, or a well of the first type in a wafer.

7. A transfer transistor of a CMOS image sensor, comprising:
- a substrate of a first type;
- a gate dielectric layer on the substrate;
- a gate on the gate dielectric layer;
- a first doped region of the first type in the substrate directly under the gate dielectric layer under the gate;
- a doped region of a second type in the substrate under the first doped region, serving as a buried channel region;
- a second doped region of the first type in the substrate under the buried channel region; and
- source/drain regions of the second type in the substrate beside the gate, wherein one source/drain region is coupled to a photodiode of the CMOS image sensor.

8. The transfer transistor of claim 7, wherein the photodiode includes a doped region of the second type in the substrate connected with the one source/drain region, and the doped region of the photodiode is deeper than the source/drain regions.

9. The transfer transistor of claim 8, wherein the second doped region is also under the source/drain regions, and a center of the second doped region is shifted relative to a center of the first doped region to be apart from the doped region of the photodiode.

10. The transfer transistor of claim 7, wherein a dopant concentration of the second doped region is lower than a dopant concentration of the first doped region.

11. The transfer transistor of claim 10, wherein the first doped region is a heavily doped region.

12. The transfer transistor of claim 7, wherein the first type is P-type and the second type is N-type, or the first type is N-type and the second type is P-type.

13. The transfer transistor of claim 7, wherein the substrate comprises a wafer of the first type, or a well of the first type in a wafer.

14. A transfer transistor of a CMOS image sensor, comprising:
- a substrate of a first type;
- a gate dielectric layer on the substrate;
- a gate on the gate dielectric layer;
- a first doped region of the first type in the substrate directly under the gate dielectric layer under the gate;
- a doped region of the first type in the substrate under the first doped region, serving as a buried channel region;
- a second doped region of the first type in the substrate under the buried channel region; and
- source/drain regions of a second type in the substrate beside the gate, wherein one source/drain region is coupled to a photodiode of the CMOS image sensor,
- wherein the buried channel region has a dopant concentration lower than two dopant concentrations of the first and the second doped regions.

15. The transfer transistor of claim 14, wherein the photodiode includes a doped region of the second type in the substrate connected with the one source/drain region, and the doped region of the photodiode is deeper than the source/drain regions.

16. The transfer transistor of claim 15, wherein the second doped region is also under the source/drain regions, and a center of the second doped region is shifted relative to a center of the first doped region to be apart from the doped region of the photodiode.

17. The transfer transistor of claim 14, wherein the dopant concentration of the second doped region is lower than the dopant concentration of the first doped region.

18. The transfer transistor of claim 17, wherein the first doped region is a heavily doped region.

19. The transfer transistor of claim 14, wherein the first type is P-type and the second type is N-type, or the first type is N-type and the second type is P-type.

20. The transfer transistor of claim 14, wherein the substrate comprises a wafer of the first type, or a well of the first type in a wafer.

* * * * *